US007658996B2

(12) United States Patent
Akedo et al.

(10) Patent No.: US 7,658,996 B2
(45) Date of Patent: Feb. 9, 2010

(54) ULTRAFINE PARTICLE BRITTLE MATERIAL HAVING POLYCRYSTAL STRUCTURE OBTAINED BY MECHANICAL AND THERMAL TREATMENT

(75) Inventors: Jun Akedo, Tsukuba (JP); Maxim Lebedev, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 11/882,852

(22) Filed: Aug. 6, 2007

(65) Prior Publication Data

US 2008/0220962 A1    Sep. 11, 2008

Related U.S. Application Data

(62) Division of application No. 10/515,492, filed as application No. PCT/JP03/06640 on May 28, 2003, now Pat. No. 7,276,193.

(30) Foreign Application Priority Data

May 28, 2002    (JP) .............................. 2002-154420

(51) Int. Cl.
*B32B 5/16* (2006.01)
(52) U.S. Cl. ...................... 428/402; 428/323; 428/328; 428/332; 428/702
(58) Field of Classification Search ................ 428/402, 428/323, 328, 332, 702
See application file for complete search history.

(56) References Cited

U.S. PATENT DOCUMENTS

| 4,285,732 A | 8/1981 | Charles et al. |
| 4,314,827 A * | 2/1982 | Leitheiser et al. ............. 51/298 |
| 4,419,125 A | 12/1983 | Charles et al. |
| 4,806,428 A * | 2/1989 | Cooper et al. ............... 428/403 |

(Continued)

FOREIGN PATENT DOCUMENTS

DE         199 35 053 A1    1/2000

(Continued)

OTHER PUBLICATIONS

Jun Akedo; Oy Buturi, vol. 68, pp. 44-47, 1999.

(Continued)

*Primary Examiner*—H. (Holly) T Le
(74) *Attorney, Agent, or Firm*—Birch, Stewart, Kolasch & Birch, LLP

(57) ABSTRACT

A method for forming an ultrafine particle brittle material at low temperature which includes the steps of applying a mechanical impact force or a pressure to a ultrafine particle brittle material so as to have a percentage in the ultrafine particles having a primary particle diameter less than 50 nm in all the particles of 10 to 90%, subjecting the resulting brittle material to a heat treatment at a temperature not higher than the sintering temperature thereof so as to have the above percentage of 50% or less, and then applying a mechanical impact force not less than the crushing strength to the resultant material, to crush the material, thereby joining the ultrafine particles in the brittle material with one another, to form a formed article of the ultrafine particle brittle material; and an ultrafine particle brittle material for use in the method.

10 Claims, 8 Drawing Sheets
(2 of 8 Drawing Sheet(s) Filed in Color)

U.S. PATENT DOCUMENTS

| | | | |
|---|---|---|---|
| 5,120,366 A * | 6/1992 | Harada et al. | 106/486 |
| 5,443,605 A | 8/1995 | Suzuki et al. | |
| 6,159,267 A | 12/2000 | Hampden-Smith et al. | |
| 6,531,187 B2 | 3/2003 | Akedo et al. | |
| 6,666,750 B1 * | 12/2003 | Rosenflanz | 451/28 |
| 6,827,634 B2 | 12/2004 | Akedo et al. | |
| 7,153,567 B1 * | 12/2006 | Akedo et al. | 428/323 |
| 7,276,193 B2 * | 10/2007 | Akedo et al. | 264/115 |
| 2002/0071905 A1 * | 6/2002 | Akedo | 427/180 |
| 2006/0201419 A1 * | 9/2006 | Akedo et al. | 118/308 |
| 2008/0241556 A1 * | 10/2008 | Akedo et al. | 428/457 |

FOREIGN PATENT DOCUMENTS

| | | |
|---|---|---|
| EP | 1 046 484 A2 | 10/2000 |
| EP | 1 231 294 A1 | 8/2002 |
| JP | 2001-3180 | 1/2001 |
| JP | 2002-235181 A | 8/2004 |

OTHER PUBLICATIONS

June Akedo; Science and Industry, vol. 76-2. pp. 1-7, 2002.

* cited by examiner

Fig. 5(a) Fig. 5(b)
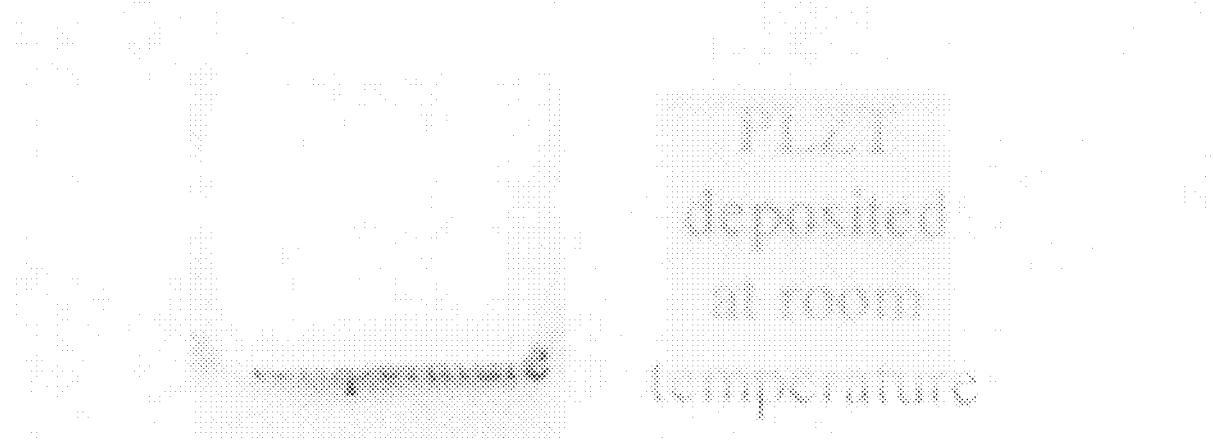
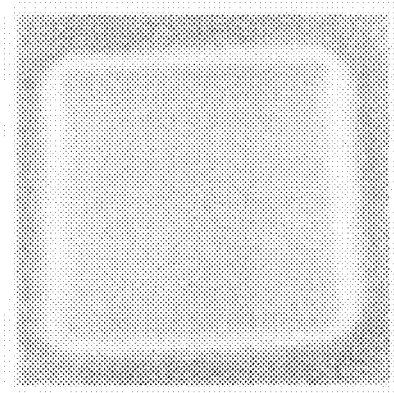 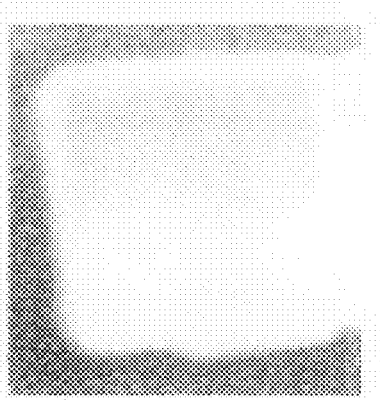
Fig. 5(c) Fig. 5(d)

ULTRAFINE PARTICLE BRITTLE MATERIAL HAVING POLYCRYSTAL STRUCTURE OBTAINED BY MECHANICAL AND THERMAL TREATMENT

CROSS-REFERENCE TO RELATED APPLICATIONS

The present application is a 37 C.F.R, § 1.53(b) divisional of U.S. application Ser. No. 10/515,492 filed Nov. 24, 2004, now U.S. Pat. No. 7,276,193, which claims priority on PCT International Application No. PCT/JP03/06640 filed May 28, 2003, which claims priority on Japanese Application No. 2002-154420 filed May 28, 2002. The entire contents of each of these applications are hereby incorporated by reference.

TECHNICAL FIELD

This invention relates to a technique for forming ultrafine particles of a brittle material, such as ceramic material; that is, forming the particles into a film or a formed article.

BACKGROUND ART

In a method for forming a brittle material at low temperature, using mechanical impact force, such as a conventional aerosol deposition method (Jun Akedo: Oyo Buturi, Vol 68, pp. 44-47, 1999; and Jun Akedo: Science and Industry, Vol 76-2, pp. 1-7, 2002) described in JP-A-2001-3180, impact force is applied to raw material particles by particle collision, the application of ultrasonic waves, or the like, so as to crush the particles, thereby forming newly generated faces, to realize bonds between the particles at low temperature. In this way, a formed article is yielded. By subjecting the raw material particles to pre-treatment of applying mechanical impact force to the particles, with a mill or the like, at this time, so that the raw material particles can be easily crushed by action of slight impact force, there is provided a method in which internal energy is stored, in the form of defects or dislocations, in the raw material particles, and atom diffusion is easily caused by slight stimulation from the outside, so that bonds between the particles can be realized at room temperature.

However, a low-temperature formed article of the brittle material formed in this way conversely contains a great number of defects or dislocations. When this method is applied to electronic material or the like, electrical properties thereof are poorer than those of a material fired at high temperature. Thus, problems remain that limit the scope to which the method can be applied. If the mill treatment to which the raw material particles are subjected before being formed is excessive, surfaces of the raw material particles excessively adsorb impurities, and defects are excessively introduced into the surfaces of the raw material particles. Thus, the density of the formed film or formed article is also decreased. As a result, mechanical properties of the film or the formed article, such as the hardness and Young's module thereof, are also decreased. Thus, problems remain in that practical use thereof is hindered.

DISCLOSURE OF THE INVENTION

The present invention is a method for forming an ultrafine particle brittle material at low temperature, comprising steps of applying a mechanical impact force or a pressure to the ultrafine particle brittle material so as to have a percentage in number of the ultrafine particle brittle material particles having a primary particle diameter less than 50 nm in all the particles of 10 to 90%, and further subjecting the ultrafine panicle brittle material to a heat treatment at a temperature not higher than the sintering temperature thereof so as to have a percentage in number of the ultrafine particle brittle material particles having a primary particle diameter less than 50 nm in all the particles of 50% or less, and then applying a mechanical impact force not less than the crushing strength of the ultrafine particle brittle material to the resultant material, to crush the ultrafine particle brittle material, thereby joining the ultrafine particles in the brittle material with one another, to form a formed article of the ultrafine particle brittle material.

The present invention is also a ultrafine particle brittle material that has a primary particle diameter of 50 nm or more, and that has, on the surface thereof, no ultrafine particle brittle material particles having a primary particle diameter of less than 50 nm.

Other and further features and advantages of the invention will appear more fully from the following description, taken in connection with the accompanying drawings.

BRIEF DESCRIPTION OF THE DRAWINGS

The patent or application file contains at least one drawing executed in color. Copies of this patent or patent application publication with color drawing(s) will be provided by the office upon request and payment of the necessary fee.

FIGS. 5(a) to 5(d) are photographs showing the change in the transparency of films formed at room temperature, depending on whether or not raw material powder according to an embodiment of the present invention was subjected to heat treatment. FIG. 5(a) is a photograph of the surface of a film obtained when raw material particles subjected to no treatment (subjected to neither mechanical impact treatment nor heat treatment) were used; FIG. 5(b) is a photograph of the surface of a film obtained when raw material particles subjected to only heat treatment were used; FIG. 5(c) is a photograph of the surface of a film obtained when raw material particles subjected to mechanical impact treatment (for 5 hours), followed by heat treatment, were used; and FIG. 5(d) is a photograph of the surface of a film obtained when raw material particles subjected to mechanical impact treatment (for 30 hours), followed by heat treatment, were used. As to FIGS. 5(a) and 5(b), when the photographs were taken, a support, which characters were written, was laid beneath the film, as a measure for transparency.

FIGS. 6(a) and 6(b) respectively show results of a case of only mechanical impact force applying treatment, and results of a ease of the combination of mechanical impact force applying treatment with heat treatment.

FIGS. 7(a), 7(b), and 7(c) show the raw material powders treated with a dry mill for 1 hour, 5 hours, and 30 hours, respectively.

FIG. 11(a) shows part of the periphery of a raw material fine particle of lead zirconate titanate (PZT) after a dry mill treatment, as mechanical impact treatment, was conducted for 5 hours, and FIG. 11(b) shows part of the periphery of the raw material fine particle after the particle was further heat-treated at 800° C. in the atmosphere for 4 hours.

BEST MODES FOR CARRYING OUT THE INVENTION

Figure 1:
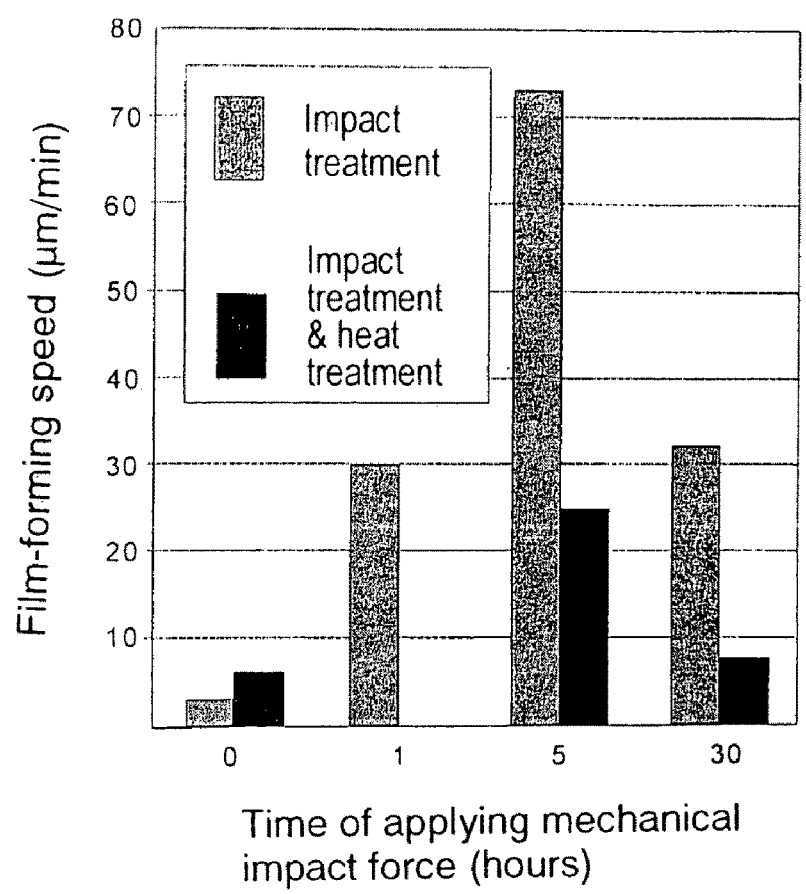
FIG. 1 is a graph showing the relationship between the time for applying mechanical impact force to raw material particles according to an embodiment of the present invention, and the film-forming speed in an aerosol deposition method.

According to the present invention, the following means are provided.
(1) A method for forming an ultrafine particle brittle material at low temperature, comprising the steps of applying a mechanical impact force or a pressure to the ultrafine particle brittle material so as to have a percentage in number of the ultrafine particle brittle material particles having a primary particle diameter less than 50 nm in all the particles of 10% to 90%, and further subjecting the ultrafine particle brittle material to a heat treatment at a temperature not higher than the sintering temperature thereof so as to have a percentage in number of the ultrafine particle brittle material particles having a primary particle diameter less than 50 nm in all the particles of 50% or less (preferably 0 to 50%), and then applying a mechanical impact force not less than the crushing strength of the ultrafine particle brittle material to the brittle material, to crush the ultrafine particle brittle material, thereby joining the ultrafine particles its die brittle material with one another, to form a formed article of the ultrafine particle brittle material.
(2) The method for forming the ultrafine particle brittle material at low temperature described in item (1), wherein the average primary particle diameter of the ultrafine particle brittle material, before the material is subjected to the mechanical impact force or pressure-applying step, is from 50 nm to 5 µm.
(3) The method for forming the ultrafine particle brittle material at low temperature described in item (1), wherein the temperature of the heat treatment of the ultrafine particle brittle material is from 200 to 1200° C.
(4) The method for forming the ultrafine particle brittle material at low temperature described in item (1), wherein the heat treatment of the ultrafine particle brittle material is performed in an oxidizing atmosphere or a reducing atmosphere, such as hydrogen.
(5) The method for forming the ultrafine particle brittle material at low temperature described in item (1), wherein the heat treatment of the ultrafine particle brittle material is performed in a reactive gas atmosphere.
(6) The method for forming the ultrafine particle brittle material at low temperature described in item (1), wherein the time of the heat treatment of the ultrafine particle brittle material is within 30 minutes.
(7) The method for forming the ultrafine particle brittle material at low temperature described in item (1), wherein the application of the mechanical impact force or the pressure to the ultrafine particle brittle material is performed in a dry atmosphere (having a water content of, e.g., 1% or less, preferably 0.5% or less).
(8) The method for forming the ultrafine particle brittle material at low temperature described in item (1), wherein the forming step is performed by an aerosol deposition method.
(9) The method for forming the ultrafine particle brittle material at low temperature described in item (1), wherein the application of the mechanical impact force or the pressure to the ultrafine particle brittle material is performed by means of a crusher.
(10) The method for forming the ultrafine particle brittle material at low temperature described in item (1), wherein, as the ultrafine particle brittle material, an ultrafine particle brittle material having a primary particle diameter of 50 nm or more, and having, on the surface thereof, no ultrafine particle brittle material having a primary particle diameter of less than 50 nm is used.
(11) The method for forming the ultrafine particle brittle material at low temperature described in item (1), wherein an ultrafine particle brittle material having a polycrystal structure that is made of microcrystals having a crystal grain diameter (crystallite size) of 20 nm to 1 µm, and having a primary particle diameter of 50 nm to 5 µm is used.
(12) The method for forming the ultrafine particle brittle material at low temperature described in any one of items (1) to (11), wherein, in the forming step, the ultrafine particle brittle material, dried (to have a water content of e.g., 1% or less, preferably 0.5% or less) after the heat treatment, is mixed with a gas (e.g. an inert gas, such as nitrogen, helium, or argon, and dry air having, a water content of 1% or less, preferably 0.5% or less), and the mixture is blown through a nozzle onto a substrate, to crush the ultrafine particle brittle material, thereby joining the ultrafine particles in the brittle material with one another, to form a formed article of the ultrafine particle brittle material
(13) An ultrafine particle brittle material that has a primary particle diameter of 50 nm or more, and that has, on the surface thereof, no ultrafine particle brittle material particles having a primary particle diameter of less than 50 nm.
(14) An ultrafine particle brittle material that has a polycrystal structure which is made of microcrystals having a crystal grain diameter (crystallite size) of 20 nm to 1 µm, and has a primary particle diameter of 50 nm to 5 µm.

Herein, ultrafine particle brittle material particles having a primary particle diameter of less than 50 nm may be present independently of each other in the ultrafine particle brittle material, or they may adhere or aggregate to the ultrafine particle brittle material having a primary particle diameter of 50 nm or more. When the percentage in number of ultrafine particle brittle material particles having a primary particle diameter of less than 50 nm in all the particles is 50% or more, the whole is usually a green compact and is not solidified at ambient temperature by an aerosol deposition method.

The primary particle diameter (size) is not equivalent to the crystal grain diameter (crystallite size), and means the primary particle diameter of particles made of joined and compounded fine crystal grains.

The term "dried" means that the water content is usually 1% or less, preferably 0.5% or less, and it is preferable to remove physical adsorption water so as to make the material into a state that only chemical adsorption water (such as crystal water) is contained.

Additional preferable embodiments of the present invention are described hereinafter; however, the present invention is not limited to them.

(15) The method for forming the ultrafine particle brittle material at low temperature described in any one of items (1) to (12), or the ultrafine particle brittle material described in item (13) or (14), wherein the percentage in the number of the ultrafine particle brittle material particles having a primary particle diameter less than 50 nm in all the particles is 10% or less (preferably 0 to 10%), before the mechanical impact force or pressure-applying step.

(16) The method for forming the ultrafine particle brittle material at low temperature described in any one of items (1) to (12), or the ultrafine particle brittle material described in item (13) or (14), wherein the primary particle diameter of the ultrafine particle brittle material is from 50 nm to 5 μm, before the mechanical impact force or pressure-applying step; the primary particle diameter thereof is from 20 nm to 1 μm, after the mechanical impact force or pressure-applying step, and the primary particle diameter thereof is from 80 nm to 5 m, after the heat treatment.

(Herein, the ultrafine particle brittle material in item (16) refers to both of the brittle material ultrafine particles present independently of each other, and the brittle material ultrafine particles adhering or aggregating with one another.)

(17) The method for forming the ultrafine particle brittle material at low temperature described in any one of items (1) to (12), or rise ultrafine particle brittle material described in item (13) or (14), wherein the thickness of a different layer (such as a contamination layer or a surface defect layer) on the particle surface of the ultrafine particle brittle material is from 3 to 5 nm, after the mechanical impact force or pressure-applying step, and the thickness of the different layer is 3 nm or less, after the heat treatment.

(18) The method for forming the ultrafine particle brittle material at low temperature described in any one of items (1) to (12), or the ultrafine particle brittle material described in item (13) or (14), wherein the particle diameters of secondary particles formed by joining or binding the primary particles of the ultrafine particle brittle material with one another range from 0.1 to 5 μm.

(19) A method for forming an ultrafine particle brittle material at low temperature, comprising the steps of applying a mechanical impact to the ultrafine particle brittle material, to adjust the crushability of the ultrafine particle brittle material and mechanical properties thereof, such as the compressive strength thereof, and further heat-treating the ultrafine particle brittle material, at a temperature not higher than the sintering-temperature of the ultrafine particle brittle material and subsequently joining the ultrafine particle brittle material particles with one another, so as to form a ultrafine particle brittle material formed product.

The crushability or the mechanical strength of the raw material particles depend on the diameter of the raw material particles and the amount of defects (stacking faults and plane defects), cracks, and dislocations introduced into the particles. Therefore, the wording "applying a mechanical impact to the ultrafine particle brittle material to adjust the crushability of the ultrafine particle brittle material and mechanical properties thereof" referred to in item (19), means that the material is subjected to mechanical impact treatment so as to increase the particle diameter of the raw material and the amount of defects, cracks, and dislocations included inside the particles, thereby adjusting the crushability and mechanical properties in subsequent steps.

Hereinafter, the present invention is described in detail.

According to the present invention, in a method for forming a brittle material at low temperature using impact force, such as an aerosol deposition method, mechanical impact force or pressure is beforehand applied to brittle material ultrafine particles, which are raw material particles, by treatment with a crusher (mill) or the like, thereby adjusting the crushability and mechanical properties (for example, the compressive strength, tensile strength, yield value, and elasticity limit value) of the ultrafine particles in subsequent steps. After this treatment of applying the mechanical impact force or the pressure is conducted or at the same time when the treatment is conducted, the raw material particles are subjected to heat-treatment at a temperature not higher than the sintering temperature of the raw material particles in an oxidizing atmosphere such as air or oxygen or in a reducing atmosphere such as hydrogen, thereby removing adsorbates, such as water molecules, nitrogen molecules and extraneous materials, formed on the surfaces of the ultrafine particles, so as to adjust the amount of cracks, defects and dislocations introduced into the particles in accordance with desired electrical properties. The two pre-treatments make it possible to yield treated particles having characteristics suitable for the above-mentioned method for forming brittle material at low temperature. The treated particles are used to be subjected to an aerosol deposition method, thereby making it possible to yield a molded product excellent in film-formability, formability, electrical properties and mechanical properties. Specifically, in the present invention, before and after each of the first pre-treatment, in which mechanical impact force or the like is applied, and the second pre-treatment, which is heat treatment after the first pre-treatment, the particle sizes of the treated particles are adjusted, whereby the mechanical properties of the treated particles can be adjusted. In other words, it is preferable that before the first pre-treatment, the ratio of the number of the particles having a primary particle diameter of less than 50 nm in that of all the particles before being crushed is 1.0% or less; after the crushing, which is the first treatment, the ratio of the number of the particles having a primary particle diameter of less than 50 nm in that of all the particles is from 10 to 90%; and after the heat treatment (the second pre-treatment) is further conducted after the crushing treatment, the ratio of the number of the particles having a primary particle diameter of less than 50 nm in that of all the particles is 50% or less.

In the present invention, the forming the ultrafine particle brittle material at low temperature means that the used ultrafine particle brittle material is formed at a temperature lower than the sintering temperature of the material. The sintering starting temperature depends on not only the composition of the brittle material but also the primary particle diameter thereof. The method of the present invention can be performed at a lower temperature than this sintering starting temperature.

The mechanical impact force applying treatment as this pre-treatment step (the first pre-treatment) is performed in order not to make raw material particles minute but to increase internal energy accumulated in the form of defects or dislocations inside the microcrystal which constitutes the raw material particles by the application of the mechanical impact force, so as to decrease the impact force or pressure which is applied, at the time of forming the particles into a film or forming the particles in a subsequent step, in order to crush the brittle material ultrafine particles, thereby making the crushing of the particles easy at the time of the film-formation or the forming. It is therefore preferred that the power and time for applying the mechanical impact force in the first pre-treatment are adjusted so that the raw material particles will not be made minute by excessive crushing or pulverizing. It is unnecessary that the magnitude of the mechanical impact force or pressure applied in the first pre-treatment is made larger than the crushing strength of the brittle material ultrafine particles.

Thereafter, the particles are subjected to heat treatment, for example, treatment with an electric furnace in the atmosphere for 30 minutes to 10 hours, as one of the pre-treatment steps (the second pre-treatment). The particles are then formed into a film or a formed article by, for example, an aerosol deposition method. The heat treatment temperature at this temperature is a temperature at which the raw material particles are not sintered. Namely, the raw material particles are heat-treated at a temperature not higher than the sintering temperature of the particles. In general, the sintering temperature of ceramics or the like is 1000° C. or higher, and molecules of water and others, which are easily adsorbed on surfaces of particles exposed to the atmosphere, can be removed at 200° C. or higher. Accordingly, the heat treatment temperature is preferably from 200 to 1200° C., considering a large reduction in defects of the surfaces of the raw material particles, and the temperature is more preferably from 600 to 1000° C., considering that chemical adsorption water also is sufficiently removed. However, about the heat treatment time, the heat treatment for a long time may cause bonding between the particles to advance by ordinary sintering reaction, dependently on the raw material, when the heat treatment temperature is raised to 1000° C. or higher in order to attain a large decrease in surface defective layers and the like of the raw material particles. It is therefore preferred that when the heat treatment is conducted at such a high temperature, the treatment is conducted in a heat treatment time of 30 minutes or less. Alternatively, the mechanical impact force or pressure applying treatment and the heat treatment may be simultaneously conducted.

The surrounding atmosphere in the heat treatment step is not limited to the atmosphere (the air), and may be appropriately selected into an oxidizing or reducing atmosphere, a reactive gas atmosphere, or the like, dependently on electrical properties of a target brittle material (an oxide, nitride, carbide, semiconductor or the like). When the treatment is conducted in a reducing atmosphere wherein hydrogen is present, it is possible that: excessive oxygen, which is physically or chemically absorbed at an originally excessive amount on commercially available raw material particles, is adjusted to attain ideal composition-control; the electric resistance and others of the oxide are largely changed; and when the brittle material particles are mixed with metal particles or the like and the mixture is formed into a film or a formed article, the oxidization of the surface of the metal is prevented so as to give superior properties.

Hereinafter, examples of embodiments according to the present invention are described with reference to the drawings.

Examples of the brittle material which is used as raw material particles in the present invention include, lead zirconate titanates (such as PZT and PLZT), which are piezoelectric materials, wherein various admixtures are incorporated, barium titanate (BTO), ferrites wherein various admixtures are incorporated (such as NiZn ferrite, MnZn ferrite, MgMn ferrite, NiZnCu ferrite, NiZnCo ferrite, $BaFe_{12}O_{19}$ and $SrFe_{12}O_{19}$, which are M type ferrites, $BaFe_{18}O_{27}$, which is a $BaFe_2W$ type ferrite, $Ba_3Co_2Fe_{24}O_{41}$, which is a $Co_2$-Z type ferrite, $Ba_2Zn_2Fe_{12}O_{22}$, which is a $Zn_2$-Z type ferrite, $\alpha$-$Fe_2O_3$, $\beta$-$Fe_2O_2$, and $\gamma$-$Fe_2O_3$), alumina ($\alpha$-$Al_2O_3$, titania, zirconia (YSZ and $ZrO_2$), $SiO_2$, $MgB_2$, $CeFe_2$, CoO, NiO), MgO, silicon nitride, aluminum nitride, silicon carbide, apatites (various apatite type minerals such as hydroxyapatite (HAp)), oxide type superconductors (such as Y—Ba based oxide superconductors, Bi—Sr—Ca based oxide superconductors, and Tl—Ba—Ca based oxide superconductors), and semiconductor materials (such as Si, Ga and GaN).

These raw materials were used and molded into a film form at ambient temperature by an aerosol deposition method, which is a film-forming/forming method using impact force, after a pre-treatment which will be described later.

The aerosol deposition method is typically a method of mixing dry powder with a gas (for example, an inert gas such as nitrogen, helium, or argon, and dry air having a water content of 1% or less, preferably 0.5% or less), blowing the mixture onto a substrate through a nozzle inside a reduced pressure chamber to crush the raw material particles into a diameter of 50 nm or less, and forming the crushed particles into a film or a formed article to have a density of 95% or more of the theoretical density. In the method of the present invention, as the aerosol deposition method, a known method can be used. For example, a method described in the above-mentioned JP-A-2001-3180 or the like can be used. The JP-A-2001-3180 is incorporated herein for reference. According to the aerosol deposition method, the brittle material ultrafine particles are joined with one another and further some parts of the ultrafine particles can be joined with the substrate.

The film-forming/forming of the aerosol deposition method was performed at a particle velocity of 30 to 500 m/sec under a reduced pressure of 10 Torr or less. As the raw material particles, various particles having an average primary particle diameter of 50 nm to 5 μm were used. As the substrate onto which the raw material particles were blown by the aerosol deposition method, there were used various substrate, such as a Si wafer, stainless steels (SUS304, 316 and so on), quartz glass, a quartz wafer, and plastics (such as acrylonitrile-butadiene-styrene resin (ABS), polyethylene terephthalate (PET), polytetrafluoroethylene (PTFE), polyimide, polymethyl methacrylate (PMMA), epoxy resin, polystyrene, vinyl resin, polycarbonate, and polypropylene).

In the mechanical impact force or pressure applying treatment, the raw material particles were subjected to mechanical impact force applying treatment with a planetary mill (PM-1200 or MT-100 (trade name) manufactured by Seishin Enterprise Co., Ltd.). It appears that this would make it possible to crush the brittle material ultrafine particles in a subsequent film-forming/forming step.

This mechanical impact force applying treatment with the mill is not any treatment for making the raw material particles minute but is a treatment for increasing internal energy accumulated in the form of defects or dislocations inside the raw material particles by the application of the mechanical impact force, so as to decrease the impact force or pressure which is applied, at the time of forming the particles into a film or a formed article. Accordingly, the power and time for applying the mechanical impact force are adjusted so that the raw material particles will not be made minute by excessive crushing or pulverizing.

In the present embodiment, as such a mechanical impact force applying treatment, the following pre-treatment was conducted: a treatment in which zirconia, alumina or stainless steel balls, which had a diameter of 3 mm or more, and the raw material particles were put into a zirconia, alumina or stainless steel pot and then the pot was fitted to a crusher such as a planetary mill, vibration mill, ball mill, attractor mill or dyno mill in a dry state, in which water or any other solvent is not used, at a rotational speed of 50 to 300 rpm (applied acceleration: 1G or more) for 10 minutes to 30 hours. If the mechanically-impacting treatment (the first pre-treatment) of the raw material particles (powder) is performed by wet pulverization, the raw material powder is excessively made minute by the invasion of solvent (water, alcohol or the like) onto the surface of the particles or inside cracks therein so that the above-mentioned desired particle-size-adjustment may not be attained. It is therefore preferred that the raw material particles are set to a crusher under a dry condition. It is preferred that the relative humidity at this time is controlled into 50% or less.

Thereafter, an electric furnace was used to conduct heat treatment in the atmosphere for 30 minutes to 10 hours as one of the pre-treatments. Thereafter, film-forming or forming was performed by the above-mentioned aerosol deposition method. The heat treatment at this time is a temperature at which the raw material particles are not sintered. Namely, the film-forming or forming is performed at a temperature not higher than the sintering temperature of the raw material particles. In general, the sintering temperature of ceramics or the like is 1000° C. or higher, and molecules of water and others, which are easily adsorbed on surfaces of particles exposed to the atmosphere, can be removed at 200° C. or higher. Accordingly, the heat treatment temperature is preferably from 200 to 1200° C. considering a large reduction m defects of the surfaces of the raw material particles, and the temperature is more preferably from 600 to 1000° C., considering that chemical adsorption water also is sufficiently removed. However, about the heat treatment time, the heat treatment for a long time may cause bonding between the particles to advance by ordinary sintering reaction, dependently on the raw material, when the heat treatment temperature is raised to 1000° C. or higher in order to attain a large decrease in surface defective layers and the like of the raw material particles. It is therefore preferred that when the heat treatment is conducted at such a high temperature, the treatment is conducted in a heat treatment time of 30 minutes or less.

The surrounding atmosphere in the heat treatment step is not limited to the atmosphere (the air), and may be appropriately selected into an oxidizing or reducing atmosphere, a reactive gas atmosphere, or the like, dependently on the electrical property of a target brittle material (an oxide, nitride, carbide, semiconductor or the like). When the treatment is conducted in a reducing atmosphere wherein hydrogen is present, it is possible that: excessive oxygen, which is physically or chemically absorbed at an originally excessive amount on commercially available raw material particles, is adjusted to attain ideal composition-control; the electric resistance and others of the oxide are largely changed; and when the brittle material particles are mixed with metal particles or the like and the mixture is formed into a film or a formed article, the oxidization of the surface of the metal is prevented so as to give superior properties.

The ultrafine particle brittle material formed product obtained according to the method of the present invention may be further subjected to heat treatment. The molded product made of, for example, a ferroelectric and piezoelectric material such as PZT (lead zirconate titanate) or BTO (barium titanate), a ferromagnetic material or an electroconductive ceramic is subjected to the heat treatment after the forming, whereby the electrical properties thereof can be further improved. As such heat treatment after the forming step, heat treatment which is usually conducted in the art can be used. For example, lead zirconate titanate (PZT) is subjected to heat treatment in the atmosphere at 600 to 900° C. for 10 minutes to 1 hour, and barium titanate (BTO) is subjected to heat treatment in the atmosphere at 600 to 1200° C. for 10 minutes to 1 hour, whereby desired electrical properties (piezoelectricity and ferroelectricity) can be improved.

The following describes, the ultrafine particle brittle material of the present invention.

It is preferable to use, as the ultrafine particle brittle material in the method of the present invention, a ultrafine particle brittle material which has a primary particle diameter of 50 nm or more, preferably 80 nm to 5 µm and has, on the surface thereof, no ultrafine particle brittle material particles having a primary particle diameter of less than 50 nm, preferably less than 20 nm.

In the present invention, the crushing strength of raw material of the ultrafine particle brittle material is adjusted by mechanical impact force or pressure applying treatment (such as dry mill treatment). Since the crushability or mechanical strength of the raw material particles depend on the particle diameter of the raw material particles and the amount of defects (stacking faults and plane defects), cracks and dislocations included in the particles, this mechanical impact force or pressure applying treatment is effective.

Figure 7A:
FIGS. 7(a) to 7(c) are scanning electron microscopic (SEM) photographs obtained by photographing situations of raw material powders (PZT) according to an embodiment of the present invention after mechanical impact treatment.
Figure 7B:
Figure 7C:

In actual treatment, however, it is difficult that cracks, dislocations, defects and others are included in the raw material particles without generating any crushed particles having a primary particle diameter of less than 50 nm in the particles. The ultrafine particle brittle material having a primary particle diameter of less than 50 nm, which is pulverized or crushed by the first pre-treatment (or is originally contained), turns into the state that the material adheres or aggregates on the surface of ultrafine particle brittle material which is not crushed or pulverized and has adjusted crashing strength and a primary particle diameter of 50 nm or more. For example, as illustrated in FIGS. 7(a) to 7(c), in the raw material particles subjected to dry mill treatment, ultrafine fine particles having a primary particle diameter of less than 50 nm adhere or aggregate on the surfaces of ultrafine particles having a primary particle diameter of 50 nm or more, or are present independently of ultrafine particles having a primary particle diameter of 50 nm or more.

It appears that when such raw material particles are, as they are, formed a formed article or a film, the crushed or pulverized ultrafine particle brittle material having a primary particle diameter of less than 50 nm functions as a cushion for absorbing impact. Thus, subsequent crushing or activation of the particles is not sufficiently caused. As a result, the film density of the resultant formed product/film lowers so that high film hardness or superior electrical properties may not be obtained.

Figure 8A:
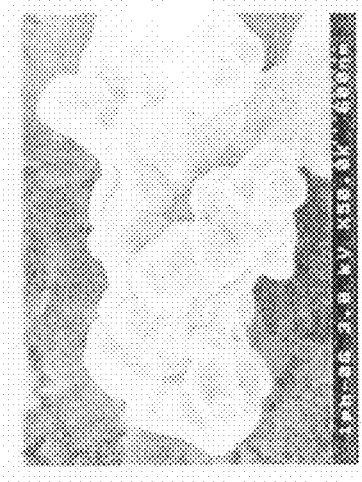
FIGS. 8(a), 8(b), and 8(c) are scanning electron microscopic (SEM) photographs obtained by photographing the raw material powders of FIGS. 7(a), 7(b), and 7(c), after the powders were treated with the dry mill and subsequently heat-treated at 800° C. in the atmosphere for 4 hours, respectively.
Figure 8B:
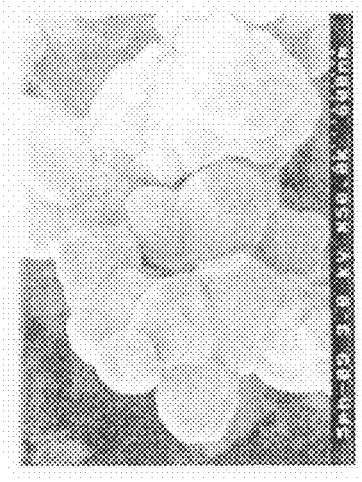
Figure 8C:
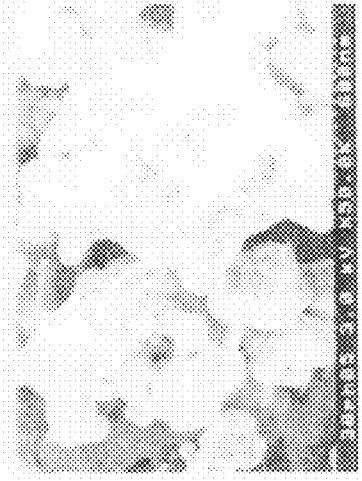
Figure 9C:
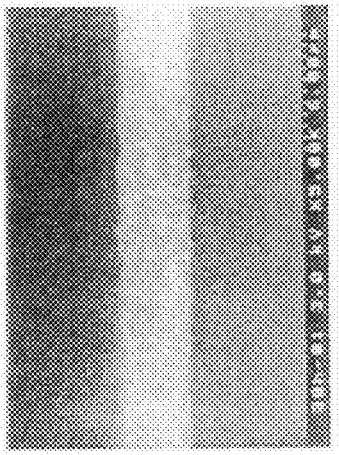
FIGS. 9(a), 9(b), and 9(c) are scanning electron microscopic (SEM) photographs obtained by photographing sections of films formed from the raw material powders of FIGS. 8(a), 8(b), and 8(c), by an aerosol deposition method, respectively.
Figure 9B:
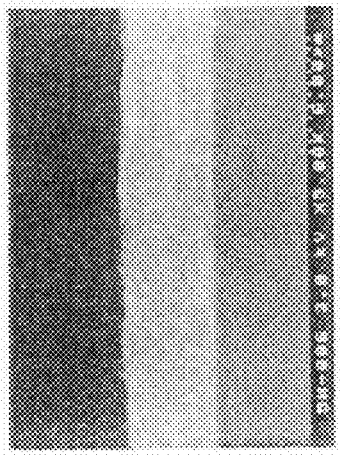
Figure 9A:
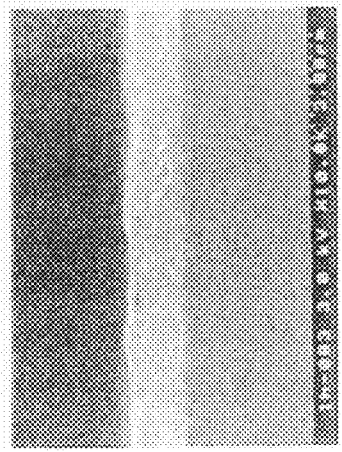
Figure 10C:
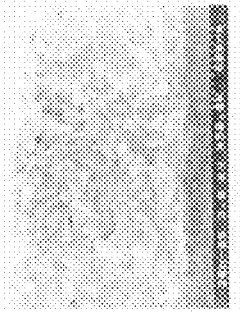
FIGS. 10(a), 10(b), and 10(c) are scanning electron microscopic (SEM) photographs obtained by photographing the film-sections of FIGS. 9(a), 9(b), and 9(c), with enlargement, respectively.
Figure 10B:
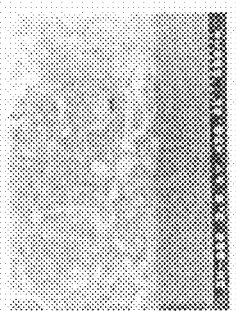
Figure 10A:
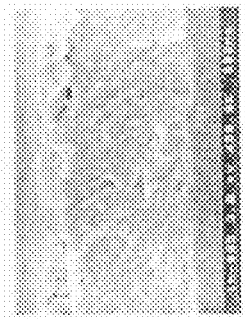

On the other hand, when the above-mentioned heat treatment is conducted as the second pre-treatment after the mechanical impact or pressure applying treatment (the first pre-treatment), the ultrafine particle brittle material which is crushed or pulverized by the first pre-treatment and has a primary particle diameter of less than 50 nm can be extinguished by the growth or recombination of the particles. A situation that the particles grow slightly at the time of this extinction was observed with a scanning electron microscope (SEM). For example, each of the raw material powders illustrated in FIGS. 7(a), 7(b) and 7(c) was subjected to dry mill treatment followed by heat treatment for 1 hour, 5 hours and 30 hours. As a result, as shown in FIGS. 8(a), 8(b) and 8(c), the ultrafine particle brittle material having a primary particle diameter of less than 50 nm, which adhered or aggregated onto the surfaces of the ultrafine particles having a primary particle diameter of 50 nm or more, or which was mixed with the ultrafine particles having a primary particle diameter of 50 nm or more, became extinct so that the particles grew slightly as a whole. These ultrafine particles subjected to the heat treatment were used to form a film by an aerosol deposition method. As a result, very dense films were obtained as shown in FIGS. 9(a), 9(b) and 9(c) as sectional SEM photographs and 10(a), 10(b) and 10(c) as enlarged sectional SEM photographs.

After this first pre-treatment step (mechanical impact applying treatment), the second pre-treatment step (heat treatment) is performed, thereby making it possible to yield raw material ultrafine particles having a preferable particle diameter range and having therein defects (stacking faults or plane defects) or cracks.

The highest temperature or time in the heat treatment step of the second-pre-treatment are also decided in accordance with relationship with the above-mentioned first pre-treatment. If the heat treatment is conducted at a temperature close to the sintering-starting-temperature for a very long time, atom diffusion increases by heat so that different layers (such as a contamination layer or a surface defect layer) on the surfaces of the raw material particles decrease. However, the defects (stacking faults or plane defects), cracks and dislocations which are formed in the first pre-treatment step and included in the raw material particles also become extinct. For this reason, mechanical properties of the raw material particles, such as the compressive strength thereof, are improved. Consequently, it cannot be expected that the film-forming speed and the formability are improved although the denseness and electrical properties of the film are improved. Accordingly, the first pre-treatment, wherein mechanical impact force is applied to the raw material particles, and the second pre-treatment, which is based on heat treatment, produce conflicting effects on the raw material particles. However, it is preferred that respective conditions are adjusted and balanced in such a manner that high moldability and film-forming speed can be compatible with good film density and electrical properties in accordance with the material property of the raw material particles.

In the second, pre-treatment step based on the heat treatment, the primary particles are recombined so that secondary particles are also formed. If the heat treatment is excessive at this time, the recombination advances so that the secondary particles become too large. As a result, etching acts when the particles are formed into a film. Thus, properties of the film may be adversely affected. Accordingly, the size of the secondary particles, which result from the recombination in the heat treatment, preferably ranges from 0.1 to 5 m. It is preferred to adjust the heat treatment temperature and the heat treatment time in this case so as to set the second particle diameter into this range.

Figures 11A, 11B:
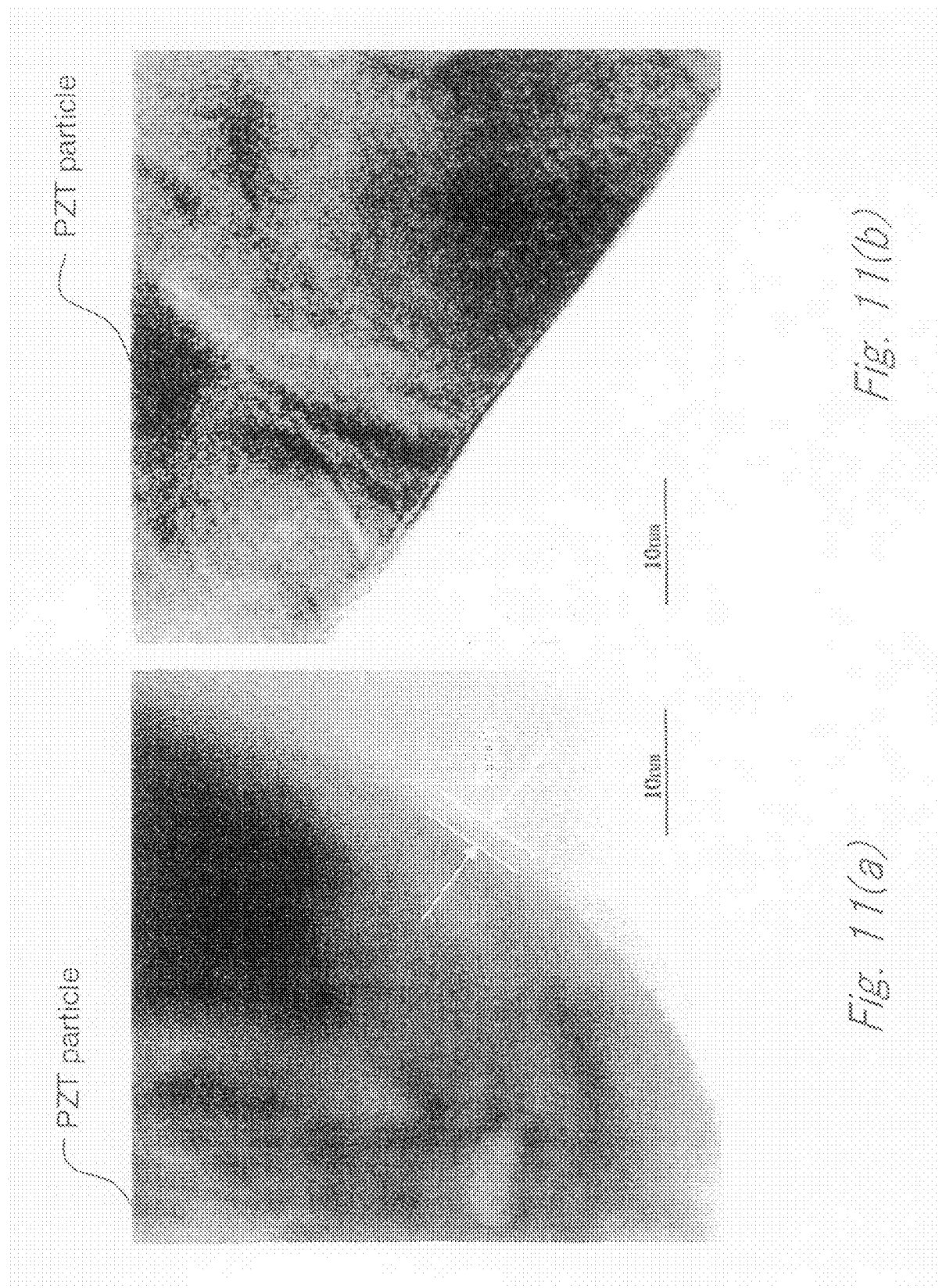
FIGS. 11(a) and 11(b) are transmission electron microscopic (TEM) photographs obtained by photographing raw material powder according to an embodiment of the present invention.

By the above-mentioned heat treatment (the second pre-treatment), any defect layer on the raw material powder surface, any contamination layer based on the adsorption of water content or atmospheric gas, and any defect layer on the surfaces of the particles are removed so that electrical properties of the film/formed article can be improved. For example, on the surfaces of the raw material particles, a different layer having a thickness of 3 to 5 nm was observed after the mechanical impact or pressure applying treatment (the first pre-treatment) (FIG. 11(a)). The thickness of this different layer became 3 nm or less after the heat treatment (the second pre-treatment) (FIG. 11(b)). This matter was observed from a transmission electron microscopic image (TEM image). In FIG. 11(b), a 3-mm thick portion outside the periphery of one out of the PZT particles is the different layer.

In this way, the first pre-treatment step (mechanical impact treatment) and the second pre-treatment step (heat treatment) are appropriately adjusted, thereby making it possible to yield a ultrafine particle brittle material having a polycrystal structure which has a primary particle diameter of 50 nm to 5 µm and is made of microcrystals having a crystal grain diameter (crystallite size) of 20 nm to 1 µm. When this ultrafine particle brittle material having the polycrystal structure is formed into a film form, a film having superior electrical properties can be obtained at a high film-forming speed. In such ultrafine particles having the polycrystal structure, which are different from secondary particles obtained by the aggregation or adhesion of primary particles, microcrystals thereof are joined with one another without containing any different layer (such as a contamination layer or a surface defect layer); therefore, electrical properties of the film/formed article obtained from this are very good. Such fine particles having the polycrystal structure have a lower mechanical strength than monocrystal structure particles having the same particle diameter; therefore, they are easily crushed from joint faces between the crystal particles as starting points. Thus, they are excellent in film-forming speed and formability in aerosol deposition method. This matter has been found out by the inventors.

The second pre-treatment together with the first pre-treatment is conducted in this way, whereby the particles are sufficiently crushed or activated by collision between the particles in a subsequent forming step. As a result, a dense and superior molded product, such as a film, having a high film hardness and superior electrical properties can be obtained.

Such raw material particles, which are subjected to mechanical impact or pressure applying treatment and heat treatment, are very effective, as raw material powder for a forming step such as an aerosol deposition method, for yielding a good film quality regardless of the material property of the brittle material.

FIG. 1 is a graph showing difference between film-forming speed in the case that PZT raw material particles were subjected to mechanical impact force applying treatment as the above-mentioned pre-treatment for 0, 1.5 and 30 hours and film-forming speed in the case that the particles were subjected to the above-mentioned heat treatment alone or the combination of the heat treatment with the mechanical impact force or pressure applying treatment.

Figures 2A, 2B, 2C, 2D:
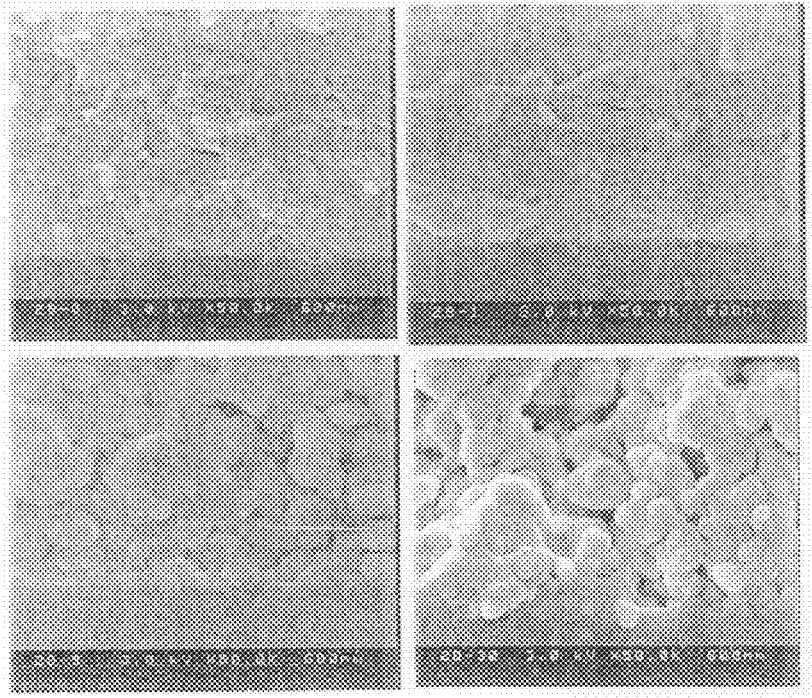
FIGS. 2(a) to 2(d) are cross-sectional SEM photographs showing the time for applying mechanical impact force to raw material particles that can be used in the present invention, and the change in the micro-structure of films formed therefrom at room temperature.

FIGS. 2(a) to 2(d) are sectional SEM (scanning electron microscope) photographs showing change in the micro-structure of films produced from particles to which various pre-treatment conditions were applied in the above-mentioned pre-treatment step, that is, particles to which the mechanical impact force was applied for 0 hour (FIG. 2(a)), 1 hour (FIG. 2(b)), 5 hours (FIG. 2(c)) and 30 hours (FIG. 2(d)).

Figures 3A, 3B, 3C, 3D:
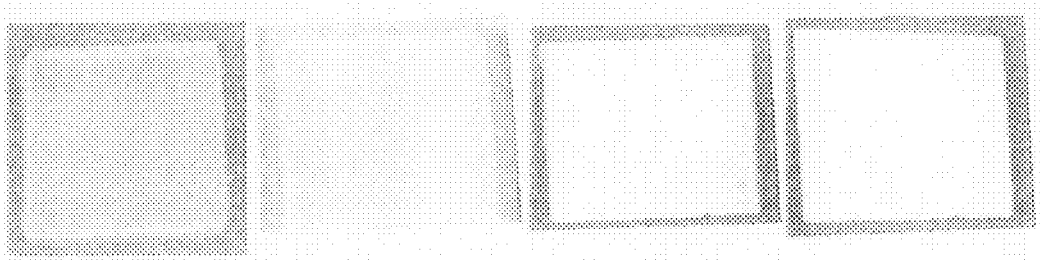
FIGS. 3(a) to 3(d) are optical micrographs showing the time for applying mechanical impact force to raw material particles that can be used in the present invention, and the change in the surface state of films formed therefrom at room temperature.

FIGS. 3(a) to 3(d) show change in optical micrographs observed from surfaces of films produced from particles to which various pre-treatment conditions were applied in the above-mentioned pre-treatment step, that is, particles to which the mechanical impact force was applied for 0 hour (FIG. 3(a)), 1 hour (FIG. 3(b)), 5 hours (FIG. 3(c)) and 30 hours (FIG. 3(d)).

Figure 4:
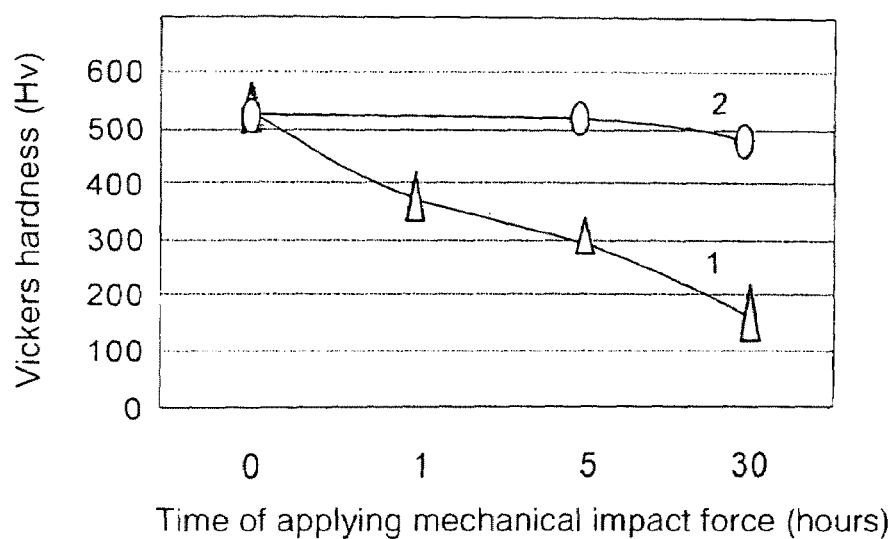
FIG. 4 is a graph showing the relationship between the time for applying mechanical impact force to raw material particles according to an embodiment of the present invention, and the Vickers hardness of PZT films produced by an aerosol deposition method.

Furthermore, FIG. 4 shows change in the Vickers hardness of films produced under various pre-treatment conditions in the above-mentioned pre-treatment step. The Vickers hardness was measured with DUH-201W ((trade name) manufactured by Shimadzu Corporation).

FIGS. 5(a) to 5(d) show results obtained by observing by the optical microscope difference in the transparency, surface state and others of the film before and after heat treatment was introduced in the above-mentioned pre-treatment.

Figure 6:
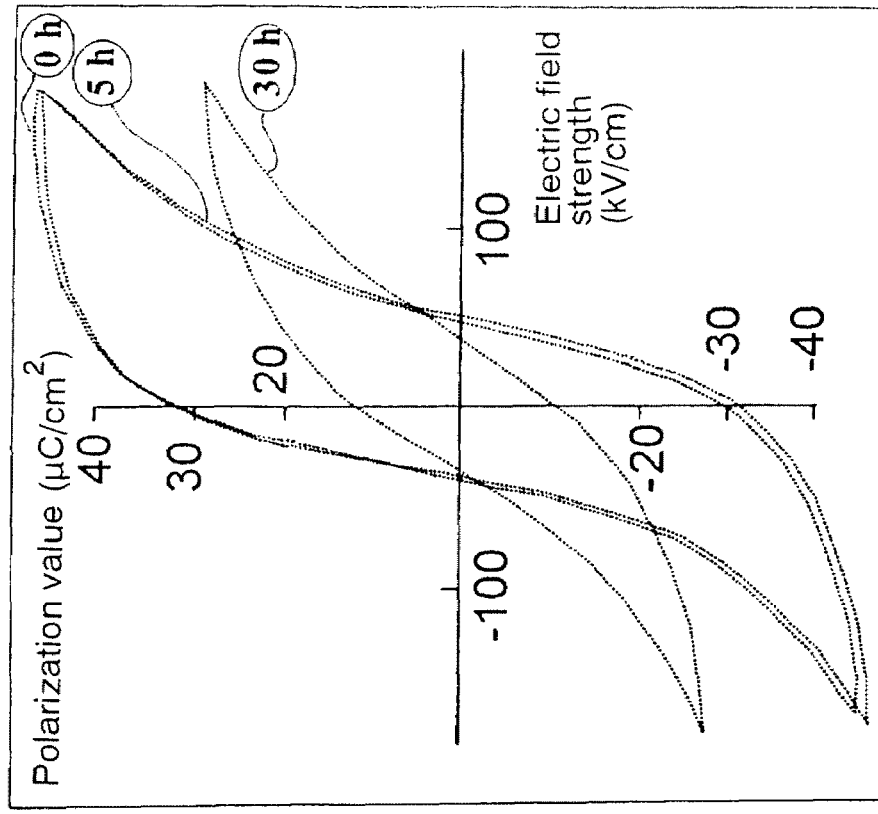
FIGS. 6(a) and 6(b) are graphs each showing a relationship between the pre-treatment effect of raw material particles according to an embodiment of the present invention, and the ferroelectricity of PZT films produced by an aerosol deposition method.
Figure 6:
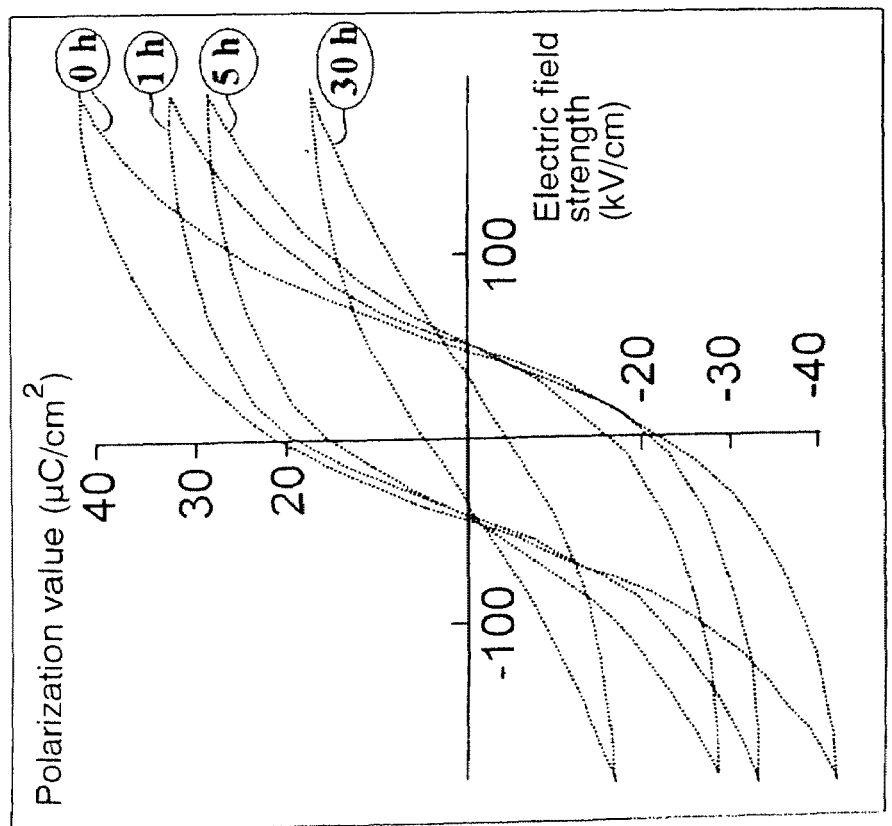

FIGS. 6(a) and 6(b) show electrical properties (residual polarization and the hysteresis characteristic of the electric field applied: ferroelectricity) of PZT films produced under the above-mentioned various conditions in the above-mentioned pre-treatment step. About the measured samples, the raw material particles subjected to the above-mentioned pre-treatment were formed into films on metal substrates made of stainless steel or the like at room temperature, without heating the substrate, by an aerosol deposition method. Thereafter, the films were subjected to heat treatment in the air for 1 hour and then measured with a hysteresis characteristic evaluating device (TF-ANALYZER 2000 (trade name) manufactured by Aix ACCT Co.).

According to FIG. 1, when the raw material particles are subjected to only the mechanical impact force applying treatment, the film-forming speed (represented by gray bars in the figure) in the aerosol deposition method is remarkably increased with an increase in the time for the treatment; and by the treatment for 5 hours, the speed reaches a value (73 µm/min.) about 30 times larger than that in the case that raw material particles not subjected to the above-mentioned pre-treatment are used. However, it is understood that when the treatment is conducted for a longer time than it, the film-forming speed is conversely lowered. This would be because the mechanical impact force applying treatment over the excessively long time causes adsorption of water molecules, impurities or others onto the surfaces of the raw material particles.

It is understood from the SEM photographs (section observation) of FIGS. 2(a), 2(b), 2(c) and 2(d) that: in the case that no heat treatment is conducted as the pre-treatment step of the raw material particles, the density of the film falls as the treatment time for applying the mechanical impact force to the raw material particles increases; and the film density becomes 90% or less of the theoretical density by the treatment for about 5 hours.

It is understood from the optical microscopic photographs (surface observation of the films) of FIGS. 3(a), 3(b), 3(c) and 3(d) that as the treatment time for applying the mechanical impact force to the raw material particles increases, the film is changed from a semitransparent yellow state to a white opaque state. This is because the film density falls to increase light scattering as the time for applying the mechanical impact force to the raw material particles increases.

About change (-▪-) in the Vickers hardness of the film shown in FIG. 4, the hardness falls as the treatment time for applying the mechanical impact force increases. This is also explained by the fall in the film density.

As described above, the effect of the pre-treatment based on mechanical impact force application makes the film-forming speed about 30 times better, and is excellent. However, the effect simultaneously makes the film density low. Thus, a problem has been made clear that use as film-forming/forming technique is restricted dependency on the use purpose thereof.

Next, results in the case that the heat treatment is conducted together with the pre-treatment step based on the mechanical impact force application are observed. About the change in the film-forming, speed of FIG. 1, in the case that only the heat treatment is applied (a black bar at zero h), the speed is made about 2 times larger than in the ease that no treatment is conducted (a gray bar at zero h in FIG. 1). When the above-mentioned heat treatment is applied to the raw material particles subjected to the pre-treatment of the mechanical impact force application (a black bar at 5 h), the film-forming speed is made lower than in the case that, only the mechanical impact force applying treatment is conducted, but the film-forming speed is made 6-10 times, larger than in the case that the raw material particles subjected to no treatment is used. Furthermore, according to an increase in the Vickers hardness of FIG. 4 (-○- in the figure) and an improvement in the transparency shown in FIGS. 5(c) and 5(d) at this time, the density of the film is improved and is restored to the same level as in the case of the raw material particles subjected to no treatment (-○- at 0 h in FIG. 4, and FIG. 5(a)).

It is therefore understood that the pre-treatment step based on the above-mentioned mechanical impact force application and the above-mentioned heat treatment are used together as pre-treatment steps for raw material particles of a brittle material fine particle low-temperature forming method, whereby high film-forming speed and formability and superior film density can be simultaneously realized so that superior mechanical properties can be obtained.

Hereby, mechanical impact or pressure applying treatment applied to the raw material particles and heat treatment at not higher than the sintering temperature are appropriately combined with each other and adjusted, whereby the density, porosity and mechanical properties of the film/molded product formed by use of impact force in an aerosol deposition method or some other method can be arbitrarily controlled.

Next, observed is a change in electrical properties, in particular, the ferroelectricity (residual polarization and the hysteresis property of the electric field applied) in a case in which PZT raw material particles of raw particles were subjected to mechanical impact force applying treatment as the above-mentioned pre-treatment step and the above-mentioned heat treatment step independently of each other or the combination thereof. FIG. 6(a) is about a case in which only the pre-treatment step based on the mechanical impact force application was conducted. It is understood that the residual polarization (Pr: the intercept between each hysteresis curve and the vertical axis) becomes lower as the treatment time becomes larger. In general, about ferroelectric material and piezoelectric material, such as PZT, electrical properties thereof are decided by the magnitude of the residual polarization thereof. As this value is larger, the material has better electrical properties. Accordingly, in the case that only the pre-treatment step based on the mechanical impact force application is conducted, the electrical properties lower. It appears that one reason for this is that the density of the thus-produced film is low.

In the meantime, a case in which the above-mentioned heat treatment is applied to raw material particles subjected to the pre-treatment step based on the mechanical impact force application is shown in FIG. 6(b). In the heat treatment at this time, raw material particles subjected to the pre-treatment based on the mechanical impact force application and those subjected to no pre-treatment were separately subjected to heat treatment at 800° C. in the atmosphere for 4 hours. As a result, it is understood that: when the heat treatment step was applied to the raw material particles, the residual polarization increased drastically; and even in the case that the pre-treatment step based on the mechanical impact force application for 5 hours was conducted, the residual polarization value as an electrical property was made better from 20 $\mu C/cm^2$ to 32 $\mu C/cm^2$ than in the case that the raw material particles subjected to no treatment were used. The residual polarization value in the case that the pre-treatment step based on the mechanical impact force application for 5 hours was conducted was substantially equivalent to that in the case that the raw material particles were subjected to only the heat treatment step. It is understood from this that a high film-forming speed resulting from the pre-treatment step based on the mechanical impact force application can be maintained.

Next, the reason why such an improvement in the electrical properties is made is analyzed from the viewpoint of raw material composition.

TABLE 1

Relationship between the pre-treatment effect of raw material particles and the raw material composition of each PZT film produced by an aerosol deposition method

| Content of the pre-treatment for raw material particles | Impact treatment time (h) | Zr/Ti | Ratio between numbers of atoms (ZR + Ti)/Pb | O/Pb |
|---|---|---|---|---|
| Case of only mechanical impact treatment | 0 | 1.08 | 0.99 | 1.41 |
|  | 5 | 1.085 | 1.02 | 1.43 |
|  | 30 | 1.09 | 1.03 | 1.45 |
| Case of the combination of mechanical impact treatment and heat treatment | 0 | 1.09 | 1.01 | 1.56 |
|  | 5 | 1.08 | 1.01 | 1.51 |
| Bulk of PZT |  | 1.0889 | 1.0 | 1.5 |

Table 1 shows results obtained by subjecting PZT raw material particles, which are raw material particles, to mechanical impact force applying treatment as the above-mentioned pre-treatment step and the above-mentioned heat treatment step independently of each other or in combination thereof, forming PZT films by an aerosol deposition method, subjecting the PZT films to heat treatment at 600° C. in the atmosphere for 1 hour, and subsequently comparing the composition distributions of the PZT films with the material composition of a bulk produced by a conventional sintering method (sintering conditions; 125° C. for 2 hours). For the analysis of the compositions, a fluorescent X-ray analyzer (ZSX 100e (trade name) manufactured by Rigaku Co.) was used. About all samples under the treatment conditions, ratios in the metal composition (lead, zirconium and titanium) thereof were not largely changed from those of the bulk. In the case that only the mechanical impact force applying treatment was conducted as the above-mentioned pre-treatment step, the oxygen composition was lower than in the case of the bulk material. It appears that this causes the above-mentioned fall in the residual polarization value as well as fall in the density. On the other hand, when the above-mentioned heat treatment was conducted together, all the material composition ratios, including the oxygen composition ratio, were sufficiently consistent with the material composition ratios in the bulk. Thus, it has been made clear that ideal material composition control can be attained.

Therefore, it has been made clear that the pre-treatment step based on the mechanical impact force application and the heat treatment step are used together with each other as pre-treatment steps for raw material particles of a brittle material fine particle low-temperature forming method, thereby making it possible to realize high, film-forming speed and formability, an excellent film density, and an ideal material composition simultaneously so as to yield excellent electrical properties.

As described above, according to the present invention, the pre-treatment step based on the mechanical impact force application and the heat treatment step are used together with each other as pre-treatment steps for raw material particles of a brittle material fine particle low-temperature forming method, thereby making it possible to realize high film-forming speed and formability, an excellent film density, and an ideal material composition simultaneously so as to yield excellent electrical properties.

In particular, according to the present invention, raw material particles preferably having an average primary particle diameter of 50 nm to 5 µm are subjected to heat treatment at the sintering temperature or lower of 200 to 1200° C., more preferably 600 to 1000° C., thereby making it possible to realize high film-formability and formability and strong bonds between the raw material particles and to provide a forming method for forming a film or a shaped product having a high density, a mechanical property of a high strength, and electrical properties close to those of a bulk obtained by firing at high temperature without applying any heat at the time of forming the film or shaped product.

INDUSTRIAL APPLICABILITY

The method of the present invention is suitable as a method for forming a ultrafine particle brittle material having good electrical properties useful as electronic material such as ferroelectric material or piezoelectric material or for forming the material into a film at a low temperature which is lower than the sintering temperature of the material.

According to the ultrafine particle brittle material of the present invention, for example, a ceramic film having controlled density and mechanical strength can be formed on a metal material or a plastic material. It is therefore possible to apply this material to the use field of a corrosion-resistant or abrasion-resistant coat, a ceramic filter, an insulating film or the like.

Having described our invention as related to the present embodiments, it is our intention that the invention not be limited by any of the details of the description, unless otherwise specified, but rather be construed broadly within its spirit and scope as set out in the accompanying claims.

The invention claimed is:

1. A brittle material formed of ultrafine particles, for use in an aerosol deposition method to form an article, the brittle material having been pretreated by (i) applying a mechanical impact force or a pressure to ultrafine particles to be crushed, and (ii) subjecting the crushed ultrafine particles to a heat treatment at a temperature not higher than the sintering temperature thereof, wherein the thus-heat-treated brittle material particle has the following characteristics:
      (a) primary particle diameter of 50 nm to 5 µm,
      (b) no piece of the ultrafine brittle material particles having a primary particle diameter of less than 50 nm is on the surface of the brittle material particle, (c) a polycrystal structure made of microcrystals, the microcrystal having a crystal grain diameter of 20 nm to 1 µm, and (d) contains defects, cracks or dislocations therein.

2. The brittle material according to claim 1, wherein the defects, cracks, or dislocations of the brittle material are adjusted so as to make the formed article have a density higher than that of an article formed from a brittle material not having been pretreated via the combination of said pretreatment of (i) and (ii).

3. The brittle material according to claim 1, wherein the defects, cracks, or dislocations of the brittle material are adjusted so as to make the formed article have a hardness higher than that of an article formed from a brittle material not having been pretreated via the combination of said pretreatment of (i) and (ii).

4. The brittle material according to claim 1, wherein the defects, cracks, or dislocations of the brittle material are adjusted so as to make the formed article have a transparency higher than that of an article formed from a brittle material not having been pretreated via the combination of said pretreatment of (i) and (ii).

5. The brittle material according to claim 1, wherein the brittle material is a ceramic material.

6. The brittle material according to claim 1, wherein the brittle material is selected from the group consisting of an oxide, a nitride, a carbide and a semiconductor material.

7. An article made by an aerosol deposition method employing the brittle material according to claim 1, wherein the hardness, transparency and density of the article is higher than the hardness, transparency and density of an article formed from a brittle material not having been pretreated via the combination of said pretreatment of (i) and (ii).

8. The article according to claim 7, wherein the defects, cracks, or dislocations of the brittle material are adjusted so as to make the formed article have a density higher than that of an article formed from a brittle material not having been pretreated via the combination of said pretreatment of (i) and (ii).

9. The article according to claim 5, wherein the defects, cracks, or dislocations of the brittle material are adjusted so as to make the formed article have a hardness higher than that of an article formed from a brittle material not having been pretreated via the combination of said pretreatment of (i) and (ii).

10. The article according to claim 7, wherein the defects, cracks, or dislocations of the brittle material are adjusted so as to make the formed article have a transparency higher than that of an article formed from a brittle material not having been pretreated via the combination of said pretreatment of (i) and (ii).

* * * * *